United States Patent [19]

Kim

[11] Patent Number: 5,538,908
[45] Date of Patent: Jul. 23, 1996

[54] METHOD FOR MANUFACTURING A BICMOS SEMICONDUCTOR DEVICE

[75] Inventor: Sung S. Kim, Kyungsangbuk-do, Rep. of Korea

[73] Assignee: LG Semicon Co., Ltd., Rep. of Korea

[21] Appl. No.: 429,906

[22] Filed: Apr. 27, 1995

[51] Int. Cl.[6] .................................. H01L 21/265
[52] U.S. Cl. ........................ 437/34; 437/59; 437/55; 148/DIG. 9
[58] Field of Search .................... 437/34, 55, 57, 437/60, 31, 59; 148/DIG. 9

[56] References Cited

U.S. PATENT DOCUMENTS

| | | |
|---|---|---|
| 4,948,990 | 8/1990 | Shin et al. . |
| 5,001,074 | 3/1991 | Arborg ........................... 437/51 |
| 5,043,600 | 8/1991 | Horiuchi . |
| 5,049,765 | 9/1991 | Young et al. . |
| 5,104,817 | 4/1992 | Scott ............................ 437/55 |
| 5,111,077 | 5/1992 | Young et al. . |
| 5,250,856 | 10/1993 | Burton et al. . |

*Primary Examiner*—Tuan H. Nguyen

[57] ABSTRACT

A semiconductor BiCMOS device and method of manufacturing suitable for attaining high packing density and thereby speeding up a switching operation, wherein the device is formed to have one of a source region or a drain region of an MOS transistor be immediately adjacent a base region of a bipolar transistor so as to be electrically connected. In this manner, an electrical terminal is eliminated, thereby permitting a higher packing density.

6 Claims, 7 Drawing Sheets

METHOD FOR MANUFACTURING A BICMOS SEMICONDUCTOR DEVICE

BACKGROUND OF THE INVENTION

1. Field of the Invention

The present invention relates to a structure and a manufacturing method of a semiconductor device, and more particularly, to a device and manufacturing method of a Bipolar CMOS (hereinafter BiCMOS) device suitable for attaining a high packing density.

2. Description of the Related Art

Generally, BiCMOS devices are widely used as high-speed switching elements, and are commonly used in output buffers.

As shown in the circuit diagram of FIG. 1, a conventional BiCMOS device is formed of an NMOS transistor and a PNP transistor.

In more detail, a signal is received via a gate G of the NMOS transistor $Q_1$, and a drain D of the NMOS transistor $Q_1$ is connected to a base B of a PNP transistor $Q_2$. An emitter E of the PNP transistor $Q_2$ is supplied with a constant voltage $V_{DD}$, and a source S of the NMOS transistor $Q_1$ and a collector C of the PNP transistor Q2 are connected so as to be commonly grounded. Thus, the signal is output via the emitter E of the PNP transistor $Q_2$.

FIG. 2 is a sectional view showing the structure of the BiCMOS device of FIG. 1, and FIGS. 3a–3c are sectional views showing the steps of manufacturing such a device.

As shown in FIG. 2, two p-type wells 3 and 4 are formed in an n-type silicon substrate 1 so as to be separated from each other and electrically isolated by a field oxide layer 2, as illustrated. A gate oxide layer 5 with a gate electrode 6 thereon is formed on the p-type well 3, and high-concentration n-type impurity regions ($n^+$) are formed on each side of the gate electrode 6 in the p-type well 3 so as to provide a source region and a drain region, respectively, of the NMOS transistor $Q_1$. In a portion of the other p-type well 4, an n-type impurity region is implanted. In a portion of the n-type impurity region so formed, a high-concentration n-type impurity is implanted to form an $n^+$ region which serves as a base B. In another portion of the n-type impurity region so formed, a high-concentration p-type impurity is implanted to form a $p^+$ region which serves as the emitter E. In another portion of the p-type well 4, a high-concentration p-type impurity region $p^+$ is implanted to serve as the collector C. On the surface of the n-type region between the base B and the emitter E, and on the surface of the p-type well 3 between the emitter E and collector C, an oxide layer 7 is formed to electrically isolate the emitter E, base B and collector C which form the PNP transistor $Q_2$.

A method of manufacturing the BiCMOS device of FIGS. 1 and 2 will now be described.

As illustrated in FIG. 3a, the field oxide layer 2 is formed in the n-type silicon substrate 1 so as to define formation regions of the NMOS transistor $Q_1$ and the PNP transistor $Q_2$. Then, p-type well 3 and p-type collector 4 are formed in the NMOS transistor formation region and PNP transistor formation region, respectively, via p-type ion implantation and diffusion.

Referring to FIG. 3b, a gate oxide layer 5 is grown in the NMOS transistor region, and polysilicon is deposited to form a gate electrode 6 via a photolithography process. Low-concentration n-type ions are implanted into a predetermined region within the p-collector 4 of the PNP transistor $Q_2$ to form the region n. Then high-concentration n-type ($n^+$) ions are implanted into the p-type well 3 on each side of the gate electrode 6 to form a source region and a drain region, respectively.

As illustrated in FIG. 3c, high-concentration p-type ($p^+$)ions are implanted into one side of the source region of the NMOS transistor $Q_1$, as well as into a portion of the region n and a portion of the p-type well 4 so as to form the emitter E and collector C of the PNP transistor $Q_2$. Then oxide layers 7 are grown between the base B, emitter E and collector C to electrically isolate these regions.

In the conventional BiCMOS device formed as above, the drain of the NMOS transistor $Q_1$ is connected to the base B of the PNP transistor $Q_2$, the gate electrode 6 of the NMOS transistor $Q_1$ is set as an input terminal, and the emitter E of the PNP transistor $Q_1$ is set as an output terminal so that the circuit as shown in FIG. 1 is obtained.

Therefore, the output electrode can be switched between two values by a signal supplied to the input electrode.

The conventional BiCMOS device, however, is disadvantageous in that a contact electrode is formed to serve as a terminal for each of the source S, drain D and gate G of the NMOS transistor and for each of the emitter E, collector C and base B of the PNP transistor $Q_2$ so as to permit each terminal to be externally connected. As a result, it is difficult to increase the packing density and switching speed.

SUMMARY OF THE INVENTION

The present invention is devised to solve the above-described problems. Accordingly, it is an object of the present invention to provide a more highly-integrated BiCMOS device.

To achieve the above object of the invention, there is provided a semiconductor device in which a drain region of an MOS transistor is immediately adjacent a base region of a bipolar transistor so as to be electrically connected to the base. In the alternative, there is provided a semiconductor device in which a source region of an MOS transistor is immediately adjacent a base region of a bipolar transistors as to be electrically connected to the base. There is also provided a method for manufacturing a semiconductor device which includes forming one of a drain region or a source region of an MOS transistor immediately adjacent a base region of a bipolar transistor so as to be electrically connected.

BRIEF DESCRIPTION OF THE DRAWINGS

The above object and advantage of the present invention will become more apparent by describing in detail preferred embodiments thereof with reference to the attached drawings in which.

DETAILED DESCRIPTION OF THE PREFERRED EMBODIMENT

Figure 1:
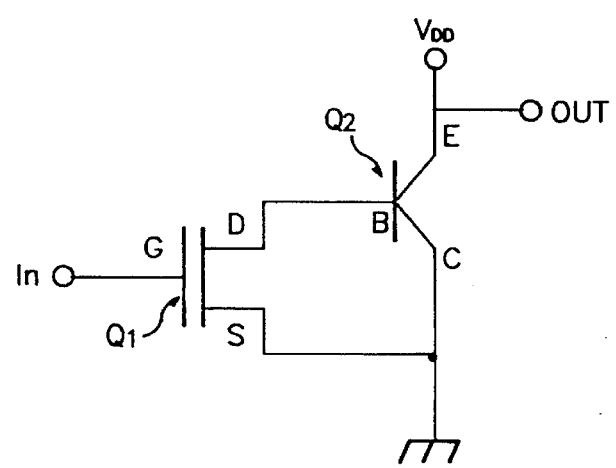
FIG. 1 is a circuit diagram of a conventional BiCMOS device.
Figure 2:
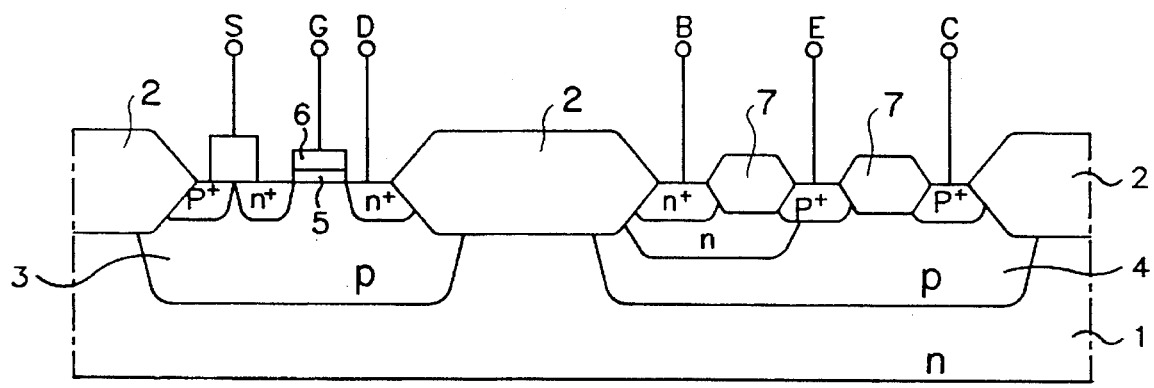
FIG. 2 is a sectional view showing the structure of the conventional BiCMOS device of FIG. 1.
Figure 3A:
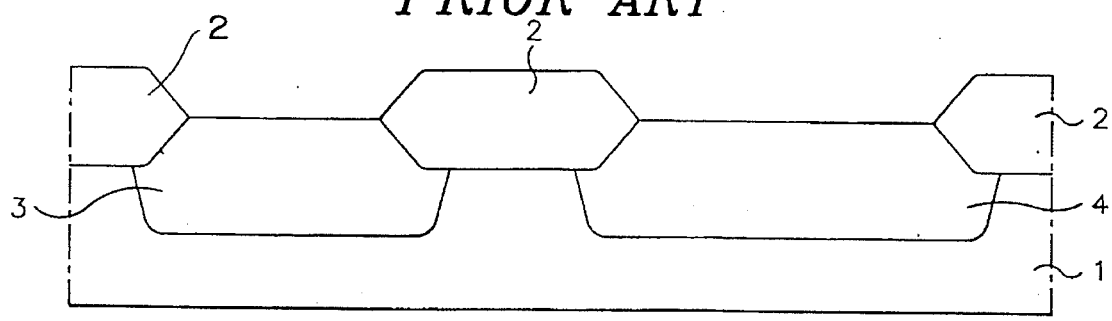
FIGS. 3a to 3c are sectional views showing manufacturing steps of the conventional BiCMOS device of FIG. 2.
Figure 3B:
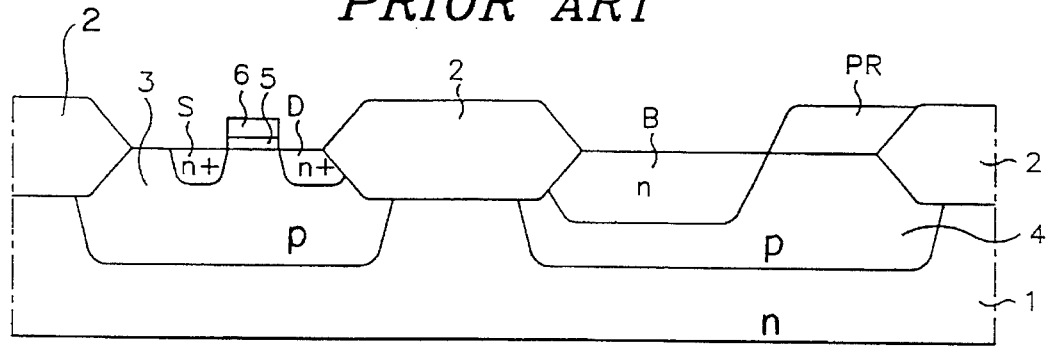
Figure 3C:
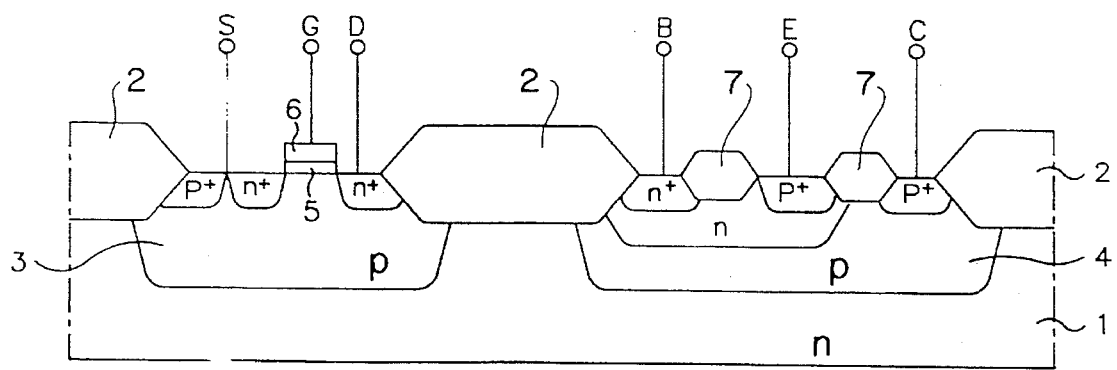
Figure 4A:
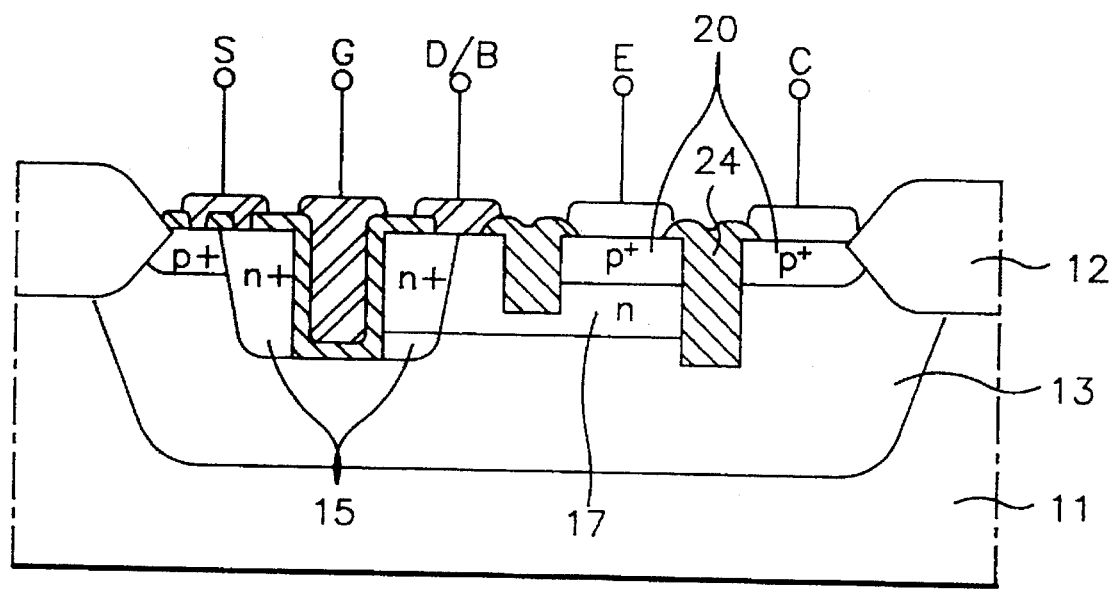
FIGS. 4a and 4b are sectional views showing a structure of a BiCMOS device according to a first embodiment and second embodiment of the present invention, respectively.

Referring to FIGS. 4a and 5, one preferred embodiment of a BiCMOS device according to the present invention will be described. As shown in FIG. 4a, a field oxide layer 12 is formed in an n-type silicon substrate 11 to define a field region and to electrically isolate an active region. A p-type well 13 is formed in the n-type silicon substrate 11 of the active region, and a trench is formed in an NMOS transistor formation region in the p-type well 13 to form a formation region for what will become a gate electrode G inside the trench. Then, high-concentration n-type ($n^+$) impurity regions 15 forming a source and a drain region, respectively, are provided on either side of the trench having the gate electrode G therein.

A PNP transistor base region 17 is formed immediately adjacent to the drain region 15 of the NMOS transistor formation region so as to be electrically connected thereto and provide a low-concentration n-type (n) impurity region within the p-type well 13. In addition to the base region 17, a high-concentration p-type ($p^+$) impurity region 20 is formed in a predetermined portion within the base region 17 so as to be an emitter region E, and the high-concentration p-type ($p^+$) impurity region 20 is formed on the p-type well 13 at one side of the emitter region E so as to be a collector region C.

The emitter region E, base region B, and collector region C are electrically isolated from each other by means of an oxide layer 24 formed within a trench.

Hereinafter, a method for manufacturing a BiCMOS device having the above-stated structure will be described.

Figure 5A:
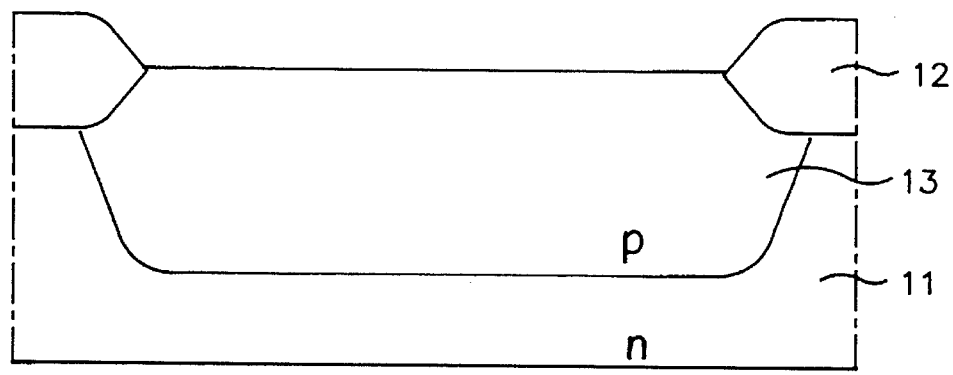
FIGS. 5a to 5i are sectional views showing manufacturing steps of the BiCMOS device according to the present invention.

Referring to FIG. 5a, the field oxide layer 12 is formed in an n-type silicon substrate 11 to define a field region and to electrically isolate an active region. A p-type impurity is ion-implanted to the active region and a drive-in process is performed to form the p-type well 13.

Figure 5B:
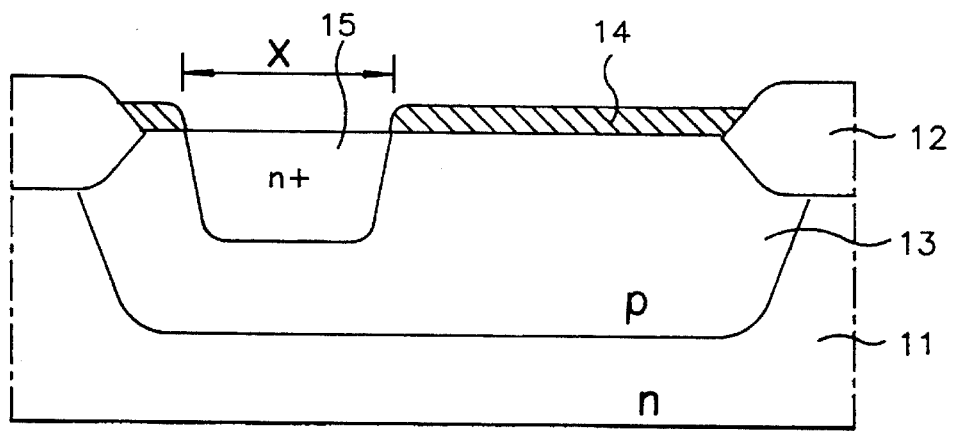

In FIG. 5b, a first photoresist layer 14 is deposited on the entire surface of the resultant structure, which is exposed and developed to form the formation region X of an NMOS transistor. Successively, high-concentration n-type ($n^+$) ions are implanted into the formation region X of the NMOS transistor through the surface of the p-type well 13 to thereby form the high-concentration n-type ($n^+$) impurity region 15.

Figure 5C:
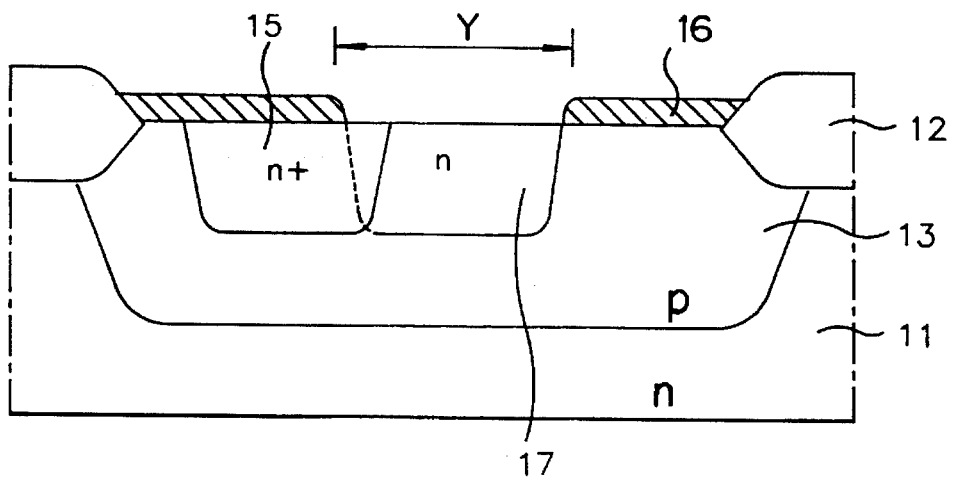

Referring to FIG. 5c a second photoresist layer 16 is then deposited on the entire surface of the resultant structure, exposed and developed to form a formation region Y of a PNP transistor. After ion-implanting the low-concentration n-type (n) impurity ions to the formation region Y so as to form the low-concentration n-type (n) impurity region 17, the photoresist layer 16 is then removed.

At this time, it should be noted that what is to become the drain in formation region X of the NMOS transistor and the base in formation region Y of the bipolar transistor are connected to each other.

Figure 5D:
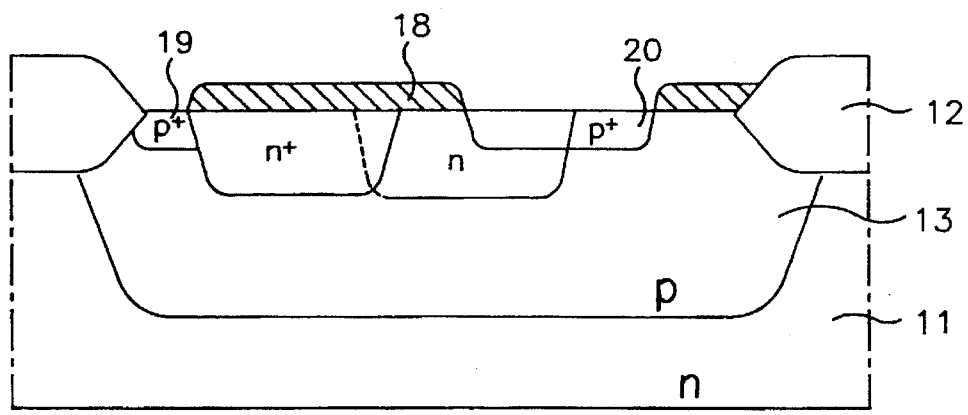

Referring to FIG. 5d, a third photoresist layer 18 is deposited on the entire surface of the resultant structure, and an exposure and development process is performed to expose a portion of the formation region X of the NMOS transistor, a portion of the formation region Y of the PNP transistor, and the p-type well 13 on one side of the base/emitter formation region Y of the PNP transistor.

After this, high-concentration p-type ($p^+$) ions are implanted into the exposed portions to form the high-concentration $p^+$-type impurity regions 19 and 20, and the third photoresist layer 18 is removed.

Figure 5E:
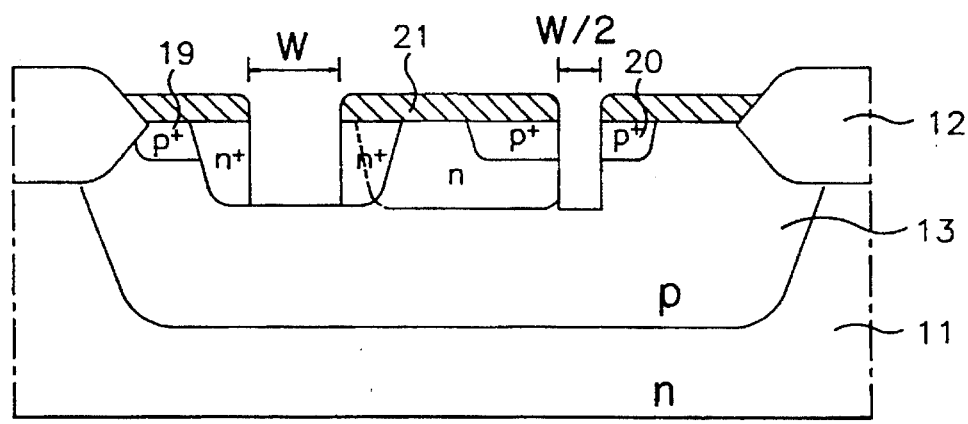

As illustrated in FIG. 5e, a fourth photoresist layer 21 is deposited on the entire surface of the resultant structure, and patterned to expose a central portion of the formation region X of what is to become the NMOS transistor and a boundary portion at one side of the formation region Y of what is to become the PNP transistor.

Here, the pattern width W at the formation region X of the NMOS transistor is formed so as to be about two times the pattern width W/2 at one side of the formation region B of the PNP transistor.

Using the fourth photoresist layer 21 as a mask, the structure is etched to form trenches, as illustrated in FIG. 5e. Thus, what are to become the source and the drain regions of the NMOS transistor and the collector/emitter of the PNP transistor are separated from each other.

Figure 5F:
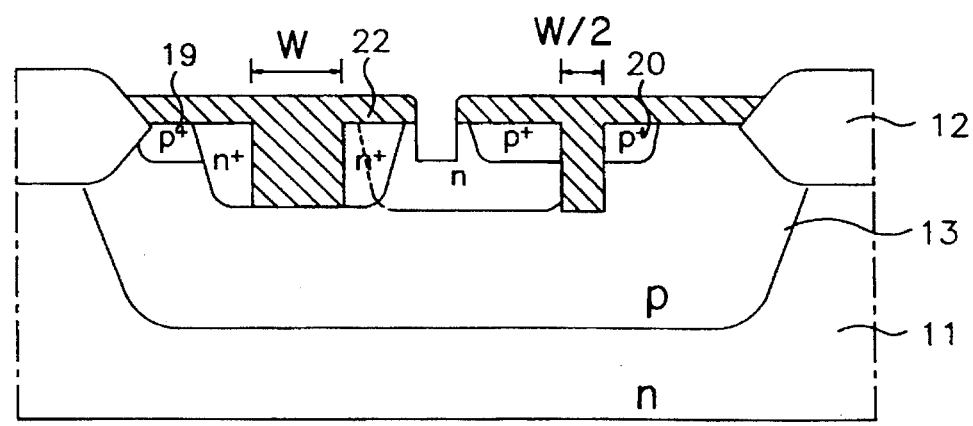

As shown in FIG. 5f, the fourth photoresist layer 21 is removed, a fifth photoresist layer 22 is deposited on the entire surface of the structure, and the formation region Y of the PNP transistor is patterned to expose a portion between what is to become the base B and emitter E. The exposed portion is etched to a predetermined depth, and the fifth photoresist layer 22 is removed. The pattern width W/2 is the same as that at employment in forming the trench at the one side of the formation region Y of the PNP transistor, and the trench here is more shallow than the foregoing trench.

Figure 5G:
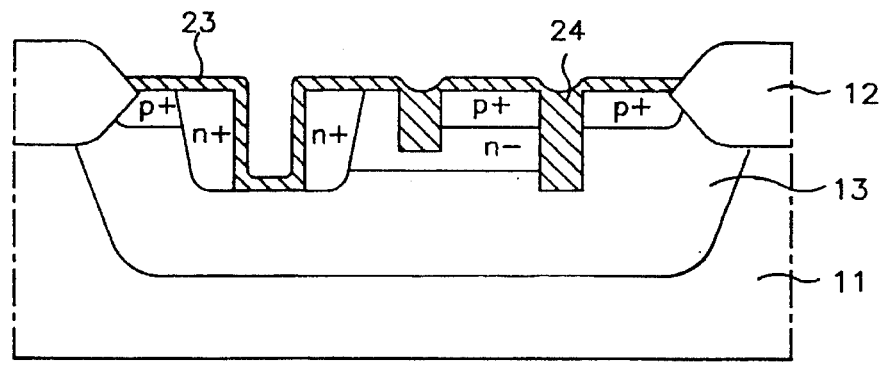

In FIG. 5g, a gate insulating layer 23 is formed on the NMOS transistor formation region, and a thick insulating layer 24 is formed on the PNP transistor formation region to fill up the trench of the bipolar transistor.

Figure 5H:
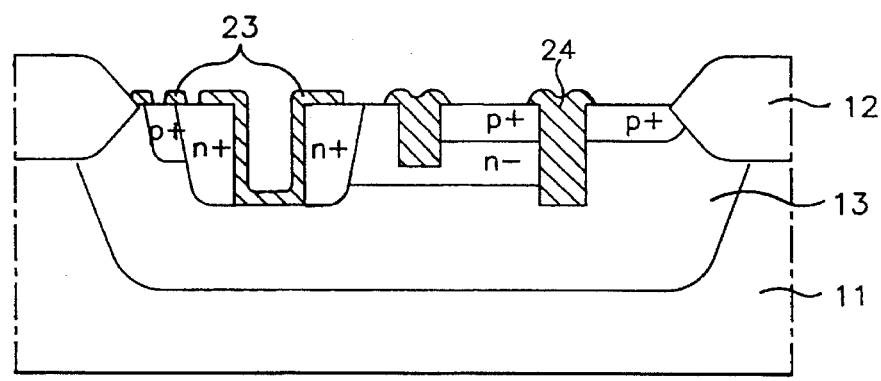

Referring to FIG. 5h, contact holes are formed in the gate insulating layer 23 for forming respective electrodes in the source region, drain/base region, and emitter/collector region.

Figure 5I:
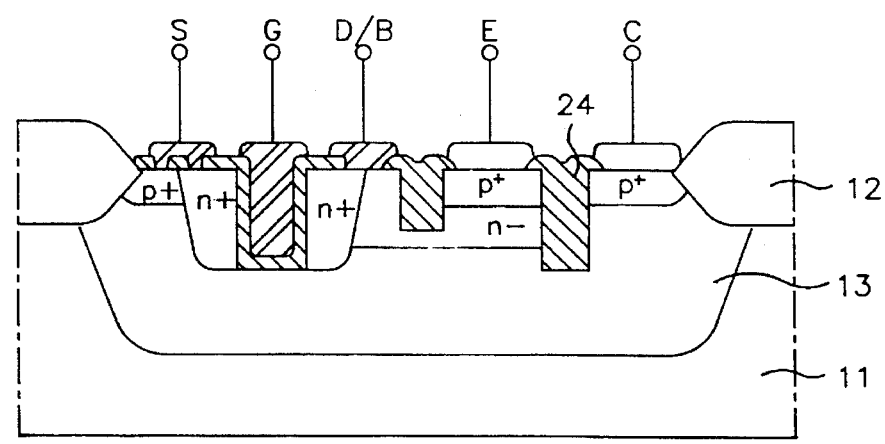

As illustrated in FIG. 5i, the trench of what is to become the gate electrode of the NMOS transistor is filled with polysilicon and electrodes is formed on the surface of the resultant structure, and is patterned to form a source electrode S, gate electrode G a drain/base electrode D/B, an emitter electrode E, and collector electrode C.

Figure 4B:
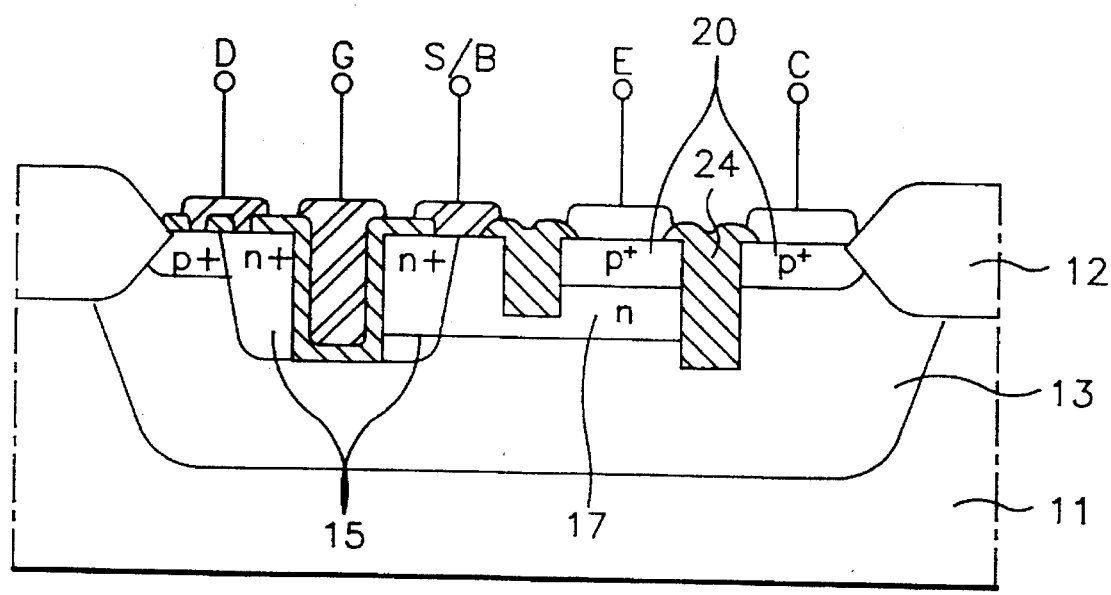

The operation of the BiCMOS device according to the present invention constructed as above is the same as the conventional one, and thus will be omitted. Further the making of the device of FIG. 4b is similar to that of FIG. 4a except that the source and drain of the CMOS transistor are reversed, and thus further description will be omitted.

Figure 6:
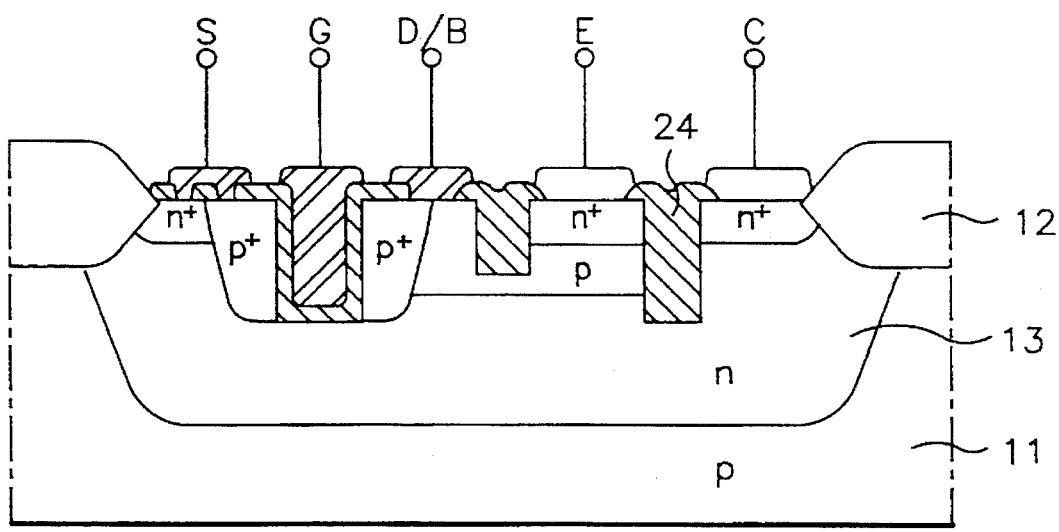
FIG. 6 illustrates another embodiment of the present invention in which the BiCMOS device using an PMOS transistor and NPN bipolar transistor are formed.

As illustrated in FIG. 6, as those of ordinary skill in the art would appreciate, it is of course possible to make the present invention using a PMOS transistor and an NPN transistor. As the manner of making this is similar to that described above for the CMOS transistor and PNP transistor except for using layers of opposite impurity concentration, a detailed explanation will be omitted.

As described above, a semiconductor device structure and method of manufacturing according to the present invention is advantageous in that a gate electrode is formed within a trench, and one of a drain or source of an MOS transistor and a base of a bipolar transistor are formed immediately adjacent one another so as to be electrically connected. As a result, high packing density is achieved to decrease the chip size as well as to speed up the switching operation.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a BiCMOS semiconductor device formed of an MOS transistor and a bipolar transistor comprising the steps of:

forming an insulating layer on a semiconductor substrate to electrically isolate a region of said substrate, said substrate having impurities of a first conductivity type in a first concentration;

forming a well, of an impurity region of a second conductivity type and having the first concentration, in the electrically isolated region of the substrate;

forming a first impurity region of the first conductivity type and having a second concentration within said well, said second concentration being higher than said first concentration;

forming a second impurity region of the first conductivity type and having the first concentration within said well so as to be adjacent said first impurity region;

forming third impurity regions, of the second conductivity type and of said second impurity concentration in the well and on a side of said first impurity region that is remote from said second impurity region, as well as within a portion of said second impurity region and in a portion of the well adjacent said second impurity region;

forming a first trench within said first impurity region and forming a second trench at a side of said second impurity region remote from said first impurity region, each trench being formed to a depth needed to remove the impurity region of the first conductivity type;

forming a third trench within said second impurity region, to a depth less than that needed to remove the impurity region of the first conductivity type;

forming an insulating layer on the surface of said first trench, on portions of the second and third impurity regions, and so as to at least partially fill said second and third trenches, respectively; and forming electrodes of the BICMOS semiconductor device.

2. The method as claimed in claim 1, wherein width of said first trench is about twice as wide as either of said second trench or said third trench.

3. The method of claim 1, wherein said step of forming electrodes includes forming contact holes in said insulating layer and filling said contact holes with a conductor.

4. A method for manufacturing a BiCMOS semiconductor device formed of an MOS transistor and a bipolar transistor comprising the steps of:

forming an oxide layer on a first area of a substrate so as to electrically isolate a second area of the substrate, said substrate having impurities of a first conductivity type in a first concentration;

forming a well by forming impurities of a second conductivity type in said first concentration in said second area of the substrate;

in a first portion of said well, forming a region having impurities of the first conductivity type in a second concentration that is higher than the first concentration, to thereby define a formation region for what will become portions of an MOS transistor;

forming a region in a second portion of the well, immediately adjacent the first portion, having impurities of the first conductivity type in the first concentration;

forming impurity regions of the second conductivity type and of the second concentration in a third portion of the well, immediately adjacent the first portion and removed from said second portion, as well as in a fourth portion of the well immediately adjacent said second portion and removed from said first portion, and in a portion of the second portion;

forming a first trench within the first portion so as to separate the remainder of the first portion into two parts, said two parts being what will become a source and drain of an MOS transistor;

forming a second trench, about one half the width of the first trench, so as to contact said second portion and said portion of the second portion and so as to lie between these portions and said fourth portion, to thereby form separated impurity regions of the second conductivity type and second concentration, which separated impurity regions will become the collector and emitter of a bipolar transistor;

forming a third trench in the second portion, said third trench being more shallow in depth than said first or said second trench;

forming an insulating layer to line the first trench, to fill up the second and third trenches, and to cover the surface of other areas above the well;

forming contact holes in said insulating layer; and filling the first trench and said contact holes with a conductor to thereby form electrodes of the BiCMOS device.

5. The method as defined in claim 4, wherein said well is formed by ion implantation.

6. The method as defined in claim 5, wherein the regions that are formed in the first, second and third portions are each formed by ion implantation.

* * * * *